(12) United States Patent
Mayor et al.

(10) Patent No.: US 6,700,388 B1
(45) Date of Patent: Mar. 2, 2004

(54) METHODS AND APPARATUS FOR DETECTING ELECTROMAGNETIC INTERFERENCE

(75) Inventors: Michael A. Mayor, Fort Wayne, IN (US); David W. Lagrow, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 132 days.

(21) Appl. No.: 10/076,568

(22) Filed: Feb. 19, 2002

(51) Int. Cl.$^7$ ........................ H01H 31/02; G01R 31/302
(52) U.S. Cl. ........................ 324/537; 324/750; 324/763
(58) Field of Search ................. 324/537, 750, 324/76.24, 76.26, 765, 501, 763; 702/75–77

(56) References Cited

U.S. PATENT DOCUMENTS

| | | | | |
|---|---|---|---|---|
| 4,287,418 A | * | 9/1981 | Divin et al. | 250/336.1 |
| 4,863,560 A | | 9/1989 | Hawkins | 216/27 |
| 4,938,841 A | | 7/1990 | Shahar et al. | 438/701 |
| 4,957,592 A | | 9/1990 | O'Neill | 216/2 |
| 5,302,830 A | * | 4/1994 | Shivanandan | 250/342 |
| 5,338,400 A | | 8/1994 | Jerman | 216/47 |
| 5,611,006 A | | 3/1997 | Tabuchi | 257/432 |
| 5,911,021 A | | 6/1999 | MacDonald et al. | 385/35 |
| 5,990,687 A | * | 11/1999 | Williams | 324/529 |
| 6,187,515 B1 | | 2/2001 | Tran et al. | 430/321 |
| 6,268,738 B1 | * | 7/2001 | Gunthorpe et al. | 324/750 |
| 6,433,531 B1 | * | 8/2002 | Regev | 324/77.11 |
| 6,437,741 B1 | * | 8/2002 | Fox | 342/417 |

\* cited by examiner

*Primary Examiner*—N. Le
*Assistant Examiner*—John Teresinki
(74) *Attorney, Agent, or Firm*—Edell, Shapiro & Finnan, LLC (57) ABSTRACT

An EMI testing scheme involves analyzing an analog input signal in frequency band segments. The input signal is passband filtered and digitally sampled before being converted to a complex analytic signal via a Hilbert transform filter and then transformed into a frequency domain signal via a Discrete Fourier Transform (DFT). Pre-stored frequency window filters are then applied to the frequency domain signal. The set of discrete filter sample points which form the window filters are designed such that particular frequency sub-bands of a desired bandwidth within the frequency segment are selected for EMI analysis. By applying different frequency window filters to the frequency domain signal, different frequency sub-bands are sequentially selected for analysis. An inverse DFT transforms the filtered signal back to the time domain, and the peak voltage of the time domain signal is compared with a threshold to determine whether EMI levels within the selected sub-band are acceptable.

49 Claims, 4 Drawing Sheets

METHODS AND APPARATUS FOR DETECTING ELECTROMAGNETIC INTERFERENCE

BACKGROUND OF THE INVENTION

1. Field of the Invention

The present invention relates to measurement of electromagnetic interference (EMI), and more particularly to high-precision automated techniques for testing and reporting EMI emissions from radiating objects.

2. Description of the Related Art

Electromagnetic interference (EMI) from radiated emissions and from conducted emissions is problematic in a wide variety of contexts. For example, power transmission lines may convey transient surges or other voltage irregularities to electrical equipment intended to be powered therefrom, such that equipment in line therewith may cause an interference to an intervening electrical bus and to the power lines themselves. This interference may compromise computer performance, television picture quality, or the functioning of other electrical equipment powered from such lines. Electromagnetic energy radiated from the equipment itself often causes severe, undesirable effects which range from poor signal quality or poor reception in radios and televisions, to complete ineffectiveness or inoperability of electronic devices.

Electronic devices, most notably electronic communication devices, typically emit some amount of undesirable EMI. These emissions may be a concern for a number of reasons. EMI emissions can potentially interfere with devices communicating in the same frequency band. As the frequency spectrum available for communications becomes increasingly crowded to meet demands for wireless communications, the importance of minimizing EMI emissions from individual devices becomes more critical. Presently, for example, U.S. Federal Communications Commission (FCC) requirements mandate that every cellular communications telephone be tested to certify EMI performance. Similarly, certain telecommunications equipment for government or military applications require strict conformance to military emissions standards.

More rigorously, EMI can broadly be divided into two main categories: natural and man-made. The former is due to atmospheric effects and can be divided into low frequency electric and magnetic fields and high frequency electromagnetic fields. The source of man-made interference is due to radio transmitters, including harmonics and spurious frequencies resulting from mixing intermediate frequencies, electroheating elements (microwaves) and digital computational devices increasingly being used in radio transceivers. Classes of interference which are specifically regulated in radiowave transmission devices include harmonics and spurious interference. For example, military standards (MIL-STD-261 E) require the following suppression:

Transmit Harmonics:−50 dBc for $2^{nd}$ and $3^{rd}$, −80 dBc for all others

Transmit Spurious:−80 dBc, where dBc is the interference power referenced to the carrier, i.e., the $2^{nd}$ and $3^{rd}$ harmonics must be 50 dB below the carrier at the antenna output. The spurious outputs are produced by intermodulation products in the IF path (for both receive and transmit).

Another concern is that electromagnetic energy radiated or conducted from electronic devices, including EMI emissions, generally contains information, which may be extractable by unintended parties. In particular, certain electronic devices not designed to emit electromagnetic signals (e.g., personal computers and conventional telephones) or designed to emit only short-range signals may nevertheless emit significant EMI signals detectable at some distance from the device. For security reasons, such devices may require certain shielding in order to prevent such devices from emitting radiation in a manner that allows an individual monitoring the emitted radiation to discern intelligible information regarding the content of the communication. Such concerns are particularly relevant to government or military systems and devices. Moreover, with the rising specter of commercial espionage and its harmful impact on commercial businesses, industries within the private sector are also placing increased emphasis on EMI testing.

To ensure compliance with EMI requirements, EMI testing is performed in a wide variety of commercial and military contexts. Currently, EMI certification is highly manpower intensive. Analysts often conduct tests literally by hand, with little or no process automation. This situation is quite similar to that faced by surveillance personnel over the last forty years where surveillance analysts in signal intelligence activities (SIGINT) spend countless hours examining monitors in an attempt to identify by sight and/or sound, signals of interest. On a reduced scale, fields of radio astronomy, as well as geophysics and biomedicine, also encounter similar manpower-intensive signal testing.

Presently, EMI testing of electronic devices is generally performed using analog equipment. Basically, a conducted or radiated signals is detected by means of an antenna attached to an analog radio frequency (RF) receiver, and the peak voltage of a time domain signal is registered (by hand) and compared to a mask or threshold provided by various standards (e.g., military or commercial standards). If the peak voltage exceeds the threshold, the electronic device(s) under test is said to fail the specific test.

These tests are generally conducted at different bandwidths in a total span of 1 GHz. More specifically, two different types of tests are conducted; a broadband scan test and a narrowband scan test. In the broadband scan, the peak voltage is measured in a 100 kHz bandwidth. In the narrowband scan, different bandwidths are selected and range from 0.5 kHz, 1.0 kHz, 5.0 kHz, 10 kHz, 25 kHz, 50 kHz, 75 kHz and 100 kHz. This process is repeated through each 100 kHz bandwidth in the total 1 GHz bandwidth.

For example, consider a conventional EMI test involving analysis of a 1 GHz bandwidth in segments of 1 kHz. The process requires assessing the signal bandwidth in 10 kHz segments looking for spurious 1 kHz tones which are audio identified by an analyst. The next step is to measure the amplitude of the audio tone, which is done by reconnecting the system (i.e., reconnecting cables). An experienced analyst can analyze between three to seven segments per second, not inclusive of the time required to measure the amplitude of detected signals; consequently, the time required to analyze the entire 1 GHz bandwidth can be on the order of eight hours and is highly susceptible to human error. Long testing times increase the duration of product development cycles and increase unit production time and cost, potentially impacting timely delivery of products.

Moreover, such a process requires expensive analog equipment, given the number of filters which have to be applied at the front end to select each one of the different bandwidths. Furthermore, each bandwidth scan has to be run separately and there is no permanent record of the final reading (i.e., the comparison with the mask or threshold).

Thus, analog testing does not provide a "history" of testing that can be later reviewed or referred to, and problems that arise during testing typically have to be solved over and over again, since only the memory of analysts can be relied upon to recall and address testing problems.

Accordingly, it would be highly desirable to implement an automated approach to EMI testing using digital signal processing techniques for detecting, analyzing, identifying, and quantifying the amplitude level of EMI signals produced from a radiating body.

SUMMARY OF THE INVENTION

Therefore, in light of the above, and for other reasons that become apparent when the invention is fully described, an object of the present invention is to automate EMI testing using digital signal processing techniques to thereby eliminate the need for human observation of signals and resulting errors.

A further object of the present invention is to reduce the time required to perform EMI testing of equipment.

Another object of the present invention is to enhance the accuracy of EMI testing.

Yet a further object of the present invention is to reduce the number of analog components required in EMI testing equipment to thereby reduce equipment size, weight and cost.

A still further object of the present invention is to permit recordation and storage of EMI measurements and signal processing parameters.

Yet another object of the present invention is to enable EMI testing to be performed off-line with recorded signals, such that EMI testing results are repeatable.

Still another object of the present invention is to have the capability to apply different signal filtering to recorded EMI measurements to refine assessments of EMI conditions.

The aforesaid objects are achieved individually and in combination, and it is not intended that the present invention be construed as requiring two or more of the objects to be combined unless expressly required by the claims attached hereto.

In accordance with the present invention, an EMI testing scheme involves analyzing an analog input signal in frequency band segments. The received analog input signal is frequency down-converted to baseband, passband filtered and digitally sampled to form digital signals representative of the analog input signal. For example, the bandwidth of the signal under test can be 1 GHz. The digital signal is supplied to a digital signal processor which converts the signal to a complex analytic signal via a Hilbert transform filter and then transforms the analytic signal into the frequency domain via a Discrete Fourier Transform (DFT). Pre-stored frequency window filters are applied to the complex frequency domain signal. The set of discrete filter sample points which form the window filters is designed such that particular narrow-bandwidth sub-bands within the frequency segment are sequentially selected for EMI analysis. By applying different frequency window filters to the frequency domain signal, different frequency sub-bands are selected for analysis. The filtered frequency domain signal is transformed back to the time domain, by means of an inverse DFT, and the peak voltage of the time domain signal is compared with a threshold to determine whether the EMI levels within the selected sub-band are acceptable.

The digital signal processing techniques of the present invention allow recordation of digitally sampled signals and processing parameters, thereby permitting precise repeatability of EMI tests and extensive off-line analysis. This capability aids in test and development of new algorithms and techniques. Another important improvement of the present invention over the prior art EMI testing is a dramatic reduction in the time required to complete EMI testing, thereby shortening product development and production time. By automating certain test functions which have been performed manually by an experienced or certified operator or EMI technician, improvements of orders of magnitude are possible. The digital signal processing techniques of the present invention can be used to recognize a particular signal or its given variations, so that the number of bandwidths that can be scanned per second is limited only by the data collection rate and algorithm processing speed. Digital signal processing also reduces the risk of human error in detecting EMI signals of concern.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DESCRIPTION OF THE PREFERRED EMBODIMENTS

The following detailed explanations of FIGS. 1–4 and of the preferred embodiments reveal the methods and apparatus of the present invention. The EMI testing process according to an exemplary embodiment of the present invention involves analyzing an analog input signal over a test bandwidth in segments by passing the signal through a detector and a down converter to bring the test bandwidth signal to baseband. The signal is then passed through an anti-aliasing filter and digitally sampled. Subsequently, a Hilbert transform converts the signal into an analytic signal $z(t)$, comprising in phase (I) and quadrature (Q) components where $z(t)=A[Re(t)+j\ Im(t)]$. The complex analytic signal is transformed to the frequency domain by means of a Discrete Fourier Transform (DFT). Prestored frequency window filters comprising weighted sample points are then used to multiply both the real (Re) and imaginary (Im) parts of the frequency domain signal. The set of discrete filter sample points are designed such that a particular frequency sub-band of a desired bandwidth is selected for EMI analysis. The filtered signal is transformed back to the time domain, by means of an inverse DFT (IDFT), and the real and imaginary parts of the signal are combined into one signal phasor whose peak voltage is measured. The peak voltage is compared with the desired threshold and the difference is recorded. Advantageously, the window filter information used in selecting the signal peak and the original sampled digital signal can be recorded along with the final EMI measurement, such that complete and absolute repeatability of the EMI testing is possible at a later time. In addition, tests may be rerun using different windows to provide enhanced spectral analysis and/or accuracy of the results.

Figure 1:
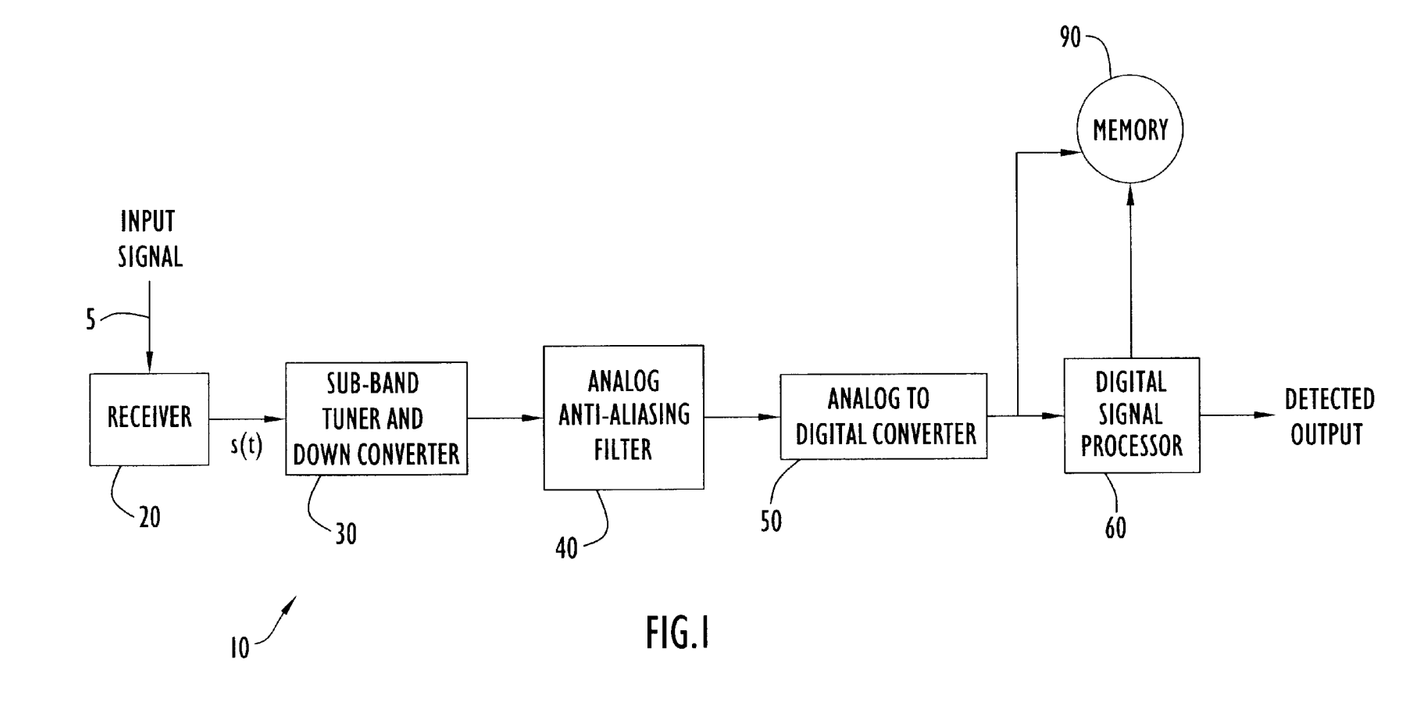
FIG. 1 is a block diagram illustrating an automated EMI test system in accordance with an exemplary embodiment of the present invention.

A functional block diagram of an automated EMI testing system 10 according to an exemplary embodiment of the present invention is shown in FIG. 1. The system includes a receiver 20, a sub-band tuner and down converter unit 30, an anti-aliasing band pass filter 40, an analog-to-digital converter 50, and a digital signal processor 60 having filtering, correlation, and measurement capabilities. The receiver, sub-band tuner and down converter, band-pass filter, and analog-to-digital converter comprise an analog front end. Alternatively, the sub-band tuner and down converter may be implemented in digital format. Analog-to-digital converter 50 represents the digital boundary between the analog front end and the digital signal processing system 60. A more detailed diagram of the digital signal processor 60 is shown in FIG. 2.

Figure 2:
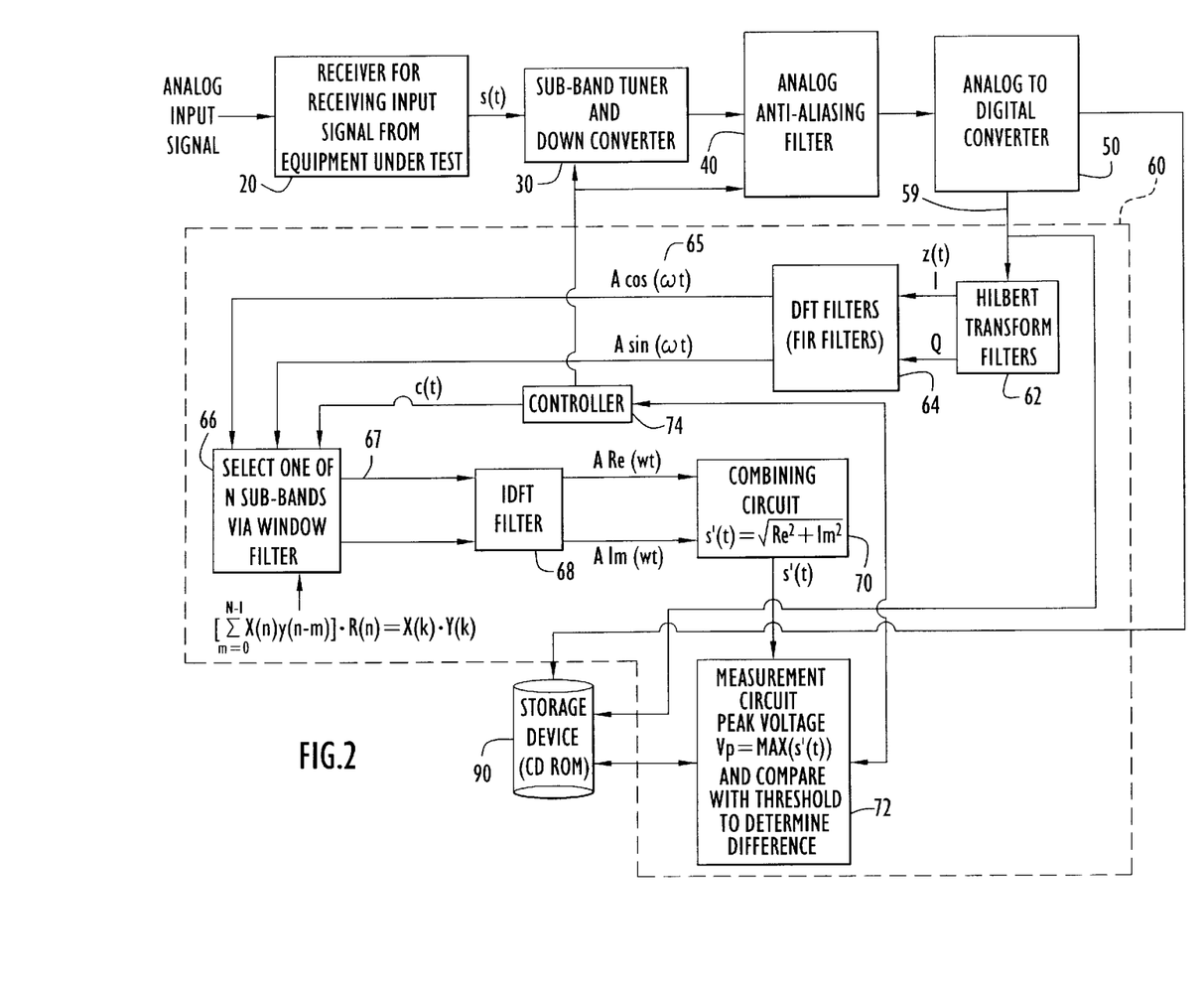
FIG. 2 is a detailed block diagram of the EMI test system of FIG. 1 according to the exemplary embodiment of the present invention.

Referring to FIGS. 1 and 2, an analog input signal 5 is received from the electronic device under test (not shown). The input signal can comprise radiated emissions received via an antenna or conducted emissions received via a conductor, such as a wire or cable. The device under test can be virtually any electrical or electronic apparatus or device capable of producing EMI in a band of interest including, but not limited to: wireless or wire-based communication devices, consumer electronic devices, computers, telephone equipment, and power-related equipment. Communication devices include any device, mobile or stationary, that is capable of transmitting and/or receiving communication signals, including: a handheld or body-mounted radio; any type of mobile or wireless telephone (e.g., analog cellular, digital cellular, PCS or satellite-based); a pager, beeper or PDA device; a radio carried on, built into or embedded in a ground-based or airborne vehicle; any portable electronic device equipped with wireless reception/transmission capabilities, including multimedia terminals capable of receiving/transmitting audio, video and/or data information; any device mounted in a fixed location with transmission/ reception capabilities; and any satellite-based communication equipment. Where a device is being tested for radiated emissions (e.g., within a testing chamber), the test signal is received by an antenna (not shown) of the test equipment. The antenna of the test equipment is place at an appropriate distance from the device under test, anywhere from a few inches to tens of feet, depending on the nature of the device and the potential interference.

For purposes of description, the band under test has a nominal test bandwidth of 1 GHz; however, it will be understood that the present invention is not limited to any particular test bandwidth. The 1 GHz bandwidth can be anywhere in the spectrum (e.g., from 125 MHz to 1125 MHz or in some other portion of the RF spectrum), limited only by the receiving capabilities of the receiver. The receiver, for example, may have a bandwidth which extends 10% on each side of the bandwidth of interest. Referring again to FIGS. 1 and 2, the input signal s(t) is passed to sub-band tuner and down converter 30 which selects the bandwidth of interest (e.g., 1 GHz) within the receiver bandwidth and heterodynes the signal to bring the 1 GHz bandwidth signal down to a baseband frequency.

An analog anti-aliasing band-pass filter 40 is applied to the down-converted signal. The anti-aliasing filtering must occur before the signal is supplied to the analog-to-digital converter 50. Once the signal is digitized, at least at twice the highest frequency component, aliasing occurs and frequencies are folded into the bandwidth of interest. This is known as the Nyquist sampling rate. The sampling rate has to be higher than both the bandwidth and any frequency component present in the bandwidth, this is one of the most important reasons why the signal is shifted to baseband before sampling.

The anti-aliased signal is supplied to the analog-to-digital converter 50 for digitally sampling the signal. To digitize a full 1 GHz bandwidth, a 2 GHz digitizer (Nyquist frequency) is required. Preferably, the digitizer has at least eight effective bits for representing the amplitude of the signal samples. The time domain signal under test can be of any suitable duration and is limited only by the available memory. For example, digitizing at 2 GHz with 8 bits per sample would fill a 2 Gigabyte memory in one second.

While, in the foregoing example, the sub-band tuner and down converter 30, anti-aliasing filter 40, and analog-to-digital converter 50 process the entire 1 GHz bandwidth of interest at one time, in accordance with another approach, the sub-band tuner and down converter 30 may select only a portion of an overall bandwidth of interest (e.g., a 10 MHz sub-band segment), and the analog-to-digital converter 50 then digitizes the sub-band signal after anti aliasing at at least the Nyquist sampling rate (e.g., at 20 MHz, with an 18 bit digitizer). In this case, the sub-band tuner and down converter 30 and anti-aliasing filter 40 are successively tuned in 10 MHz steps or increments of the overall 1 GHz bandwidth, such that the entire 1 GHz bandwidth is partitioned into one-hundred 10 MHz segments.

More specifically, in this embodiment, an analog antialiasing band-pass filter 40 having a 10 MHz pass band operates to select a particular one of the 10 MHz bandwidth segments, in which to pass the input time signals s(t). The anti-aliasing filter 40 has a 70 dB out-of-band rejection in order to sufficiently select the particular 10 MHz bandwidth without including harmonics which might otherwise cause significant degradation during signal analysis. The filtered signal is then sampled by analog-to-digital converter 50 at a sampling frequency $f_s$, of 20.48 MHz, which is above the Nyquist rate. The analog to digital conversion is preferably performed with a digitizer having at least 18 bits of effective resolution to obtain a dynamic range of 108 dB ($\frac{1}{2}^{2 \times (18)}$). The dynamic range is derived from a uniform quantizing model, where each digital bit is equivalent to approximately 6.02 dB of signal to quantizing noise power.

Observe that, even in a 10 MHz sub-band segment selected from the 1 GHz band, an interferer will be detected by a digital system through the process of aliasing. Although the exact frequency at which the interference occurred would be difficult to pinpoint until the entire band is processed, the presence of the interference would be detected.

Whether processing the entire bandwidth of interest at once (e.g., 1 GHz) or sequentially processing segments of the entire bandwidth of interest (e.g., in 10 MHz steps), the sub-band tuner and down converter 30 selects a "sub-band" in the sense that the bandwidth of the signal being processed is some portion of the overall bandwidth of the received signal. However, where the entire bandwidth of interest (1 GHz) is processed at once, the bandwidth is simply referred to herein as the bandwidth of interest (rather than as a sub-band). In contrast, where only a portion of the bandwidth of interest is down converted and digitized at one time (e.g., 10 MHz), this portion of the bandwidth is referred to as a sub-band segment of the overall bandwidth of interest. As described in greater detail hereinbelow, in either case, digital signal processing is performed on the digital signal to analyze narrower sub-bands (i.e., several sub-bands are selected within the 1 GHz or 10 MHz initial band). Thus, in the case where less that the overall bandwidth of interest is digitized at once, the term sub-band is used here in two contexts, the first is to select a 10 MHz sub-band segment in the 1 GHz entire bandwidth. The second use is selecting sub-bands within the 10 MHz bandwidth for EMI analysis via digital signal processing techniques. Accordingly, in this case, the term first sub-band tuning refers to selecting and digitizing a sub-band segment (e.g., 10 MHz) from the 1 GHz bandwidth of interest at the analog front end, and the term second sub-band tuning refers to selecting a narrower sub-band from the 10 MHz via digital signal processing of the digitized sub-band segment.

Referring again to FIG. 2, the digital signal generated by analog-to-digital converter 50 is supplied to digital signal processor 60. Digital signal processor 60 includes Hilbert transform filters 62 which perform a Hilbert transform on the input digital signal to convert the digital signal into a complex analytic signal z(t) having in-phase (I) and quadrature (Q) components such that z(t)=A[Re(t)+jIm(t)]. A complex signal contains the full information of the original signal. If the quadrature component is not obtained, then the frequency domain signal would have a quadrature component which is basically a mirror image of the real component (no information). A complex signal, on the other hand, effectively doubles the sampling rate of the input signal.

The complex signal z(t) is then transformed into the frequency domain via a discrete Fourier transform (DFT) filter 64 which has, for example, 65,536 sample points. This may be implemented using a bank of FIR filters. Preferably, the discrete Fourier transform is implemented using a fast Fourier transform (FFT) algorithm. The discrete Fourier transform produces a 65,536 point sample sequence comprising a real (A cos ωt) sequence and an imaginary (A sin ωt) sequence, where ω=2πf$_s$, where f$_s$, is the sampling frequency. In the case of a sampling frequency of approximately 20 MHz, the frequency resolution is f$_s$/N=20.48 10$^6$/65,536=312.5 Hz. The discrete frequency domain signals A cos(ωt) and A sin(ωt) are thus indicative of a frequency domain representation of the sampled digital signal. While DFT of the exemplary embodiment is a 65,536 point DFT, it will be understood that the invention is not limited to any particular size DFT, and a DFT of any suitable size may be implemented.

In the exemplary embodiment, the FFT is implemented using FIR filters; however, equivalent Infinite Impulse Response (IIR) filter may also be implemented in the time domain. A problem with the IIR implementation is that it would distort the phase, while FIRs can generally be built with linear phase. Thus, phase correction measures would also need to be applied in the case of IIR processing.

The real and imaginary frequency domain signals are correlated by means of a series of weighted filters 66. That is, prestored sampled window filters are multiplied with both the real and imaginary parts of the input signal. The window filters limit the signal in frequency. The window filters are designed to introduce sharp filters, i.e., limiting the frequencies of interest, and filtering out frequencies not of interest. By applying the basic principle that multiplication in the frequency domain is equivalent to convolution in the time domain, the filter sharpness distorts the time-domain signal and, since the voltage peaks are detected in the time-domain, a very sharp filter could introduce false peaks.

Figure 3:
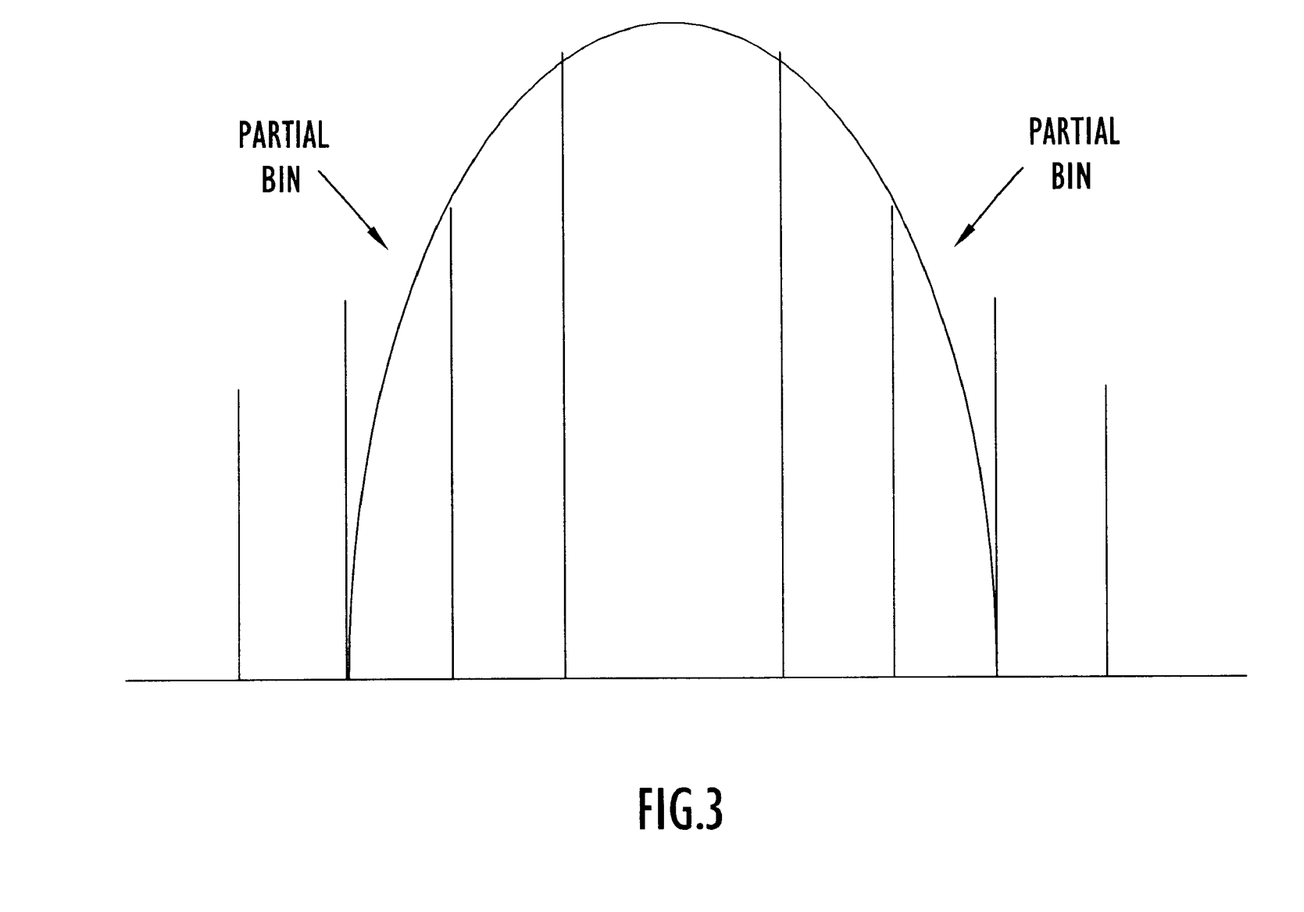
FIG. 3 illustrates the use of frequency bins for identifying electromagnetic interference in specific frequency sub-bands according to the exemplary embodiment of the present invention.

The set of discrete filter sample points or discrete weights operate to select partial frequency bins indicative of the desired bandwidth. That is, for a 1 kHz bandwidth, the center frequency is selected and repeated in 10 kHz intervals over the entire 100 kHz bandwidth, and three full frequency bins are selected with only 31.25% of the energy of the two additional bins on each side. Such a result is illustrated in FIG. 3. The term "frequency bin" refers to the DFT output point. For example a 256 point DFT contains 256 "bins". The width (in Hz) of the bin is given by W$_B$=fs/N, where f$_s$, is the sampling frequency and N is the number of the DFT points. Again, with a 20.48 MHz digitizer, a 65,536 point DFT will produce "bins" which are 312.5 Hz. This means that all energy within 312.5 Hz is concentrated in one bin. Specifically, if the start frequency is 1 kHz, the first bin contains the energy between 1000 and 1312.5 Hz, the second bin contains the energy between 1312.5 and 1625 Hz, etc.

The reason for using adjacent bins is that if interference (or any energy for that matter) is not exactly in the center of the bin, the interference will spill over into the adjacent bins (theoretically the spillover is over the entire length of the DFT; however, in practical terns, beyond adjacent bins the spillover is negligible).

With the stated numbers, f$_s$=20 MHz and N=65,536, bandwidths which are a minimum of 312.5 Hz or any multiple thereof can be analyzed. Observe that, if the sampling frequency is reduced (i.e., reduce the width of the sub-band tuner) while keeping the same number of DFT points, the DFT resolution can be increased, i.e. decrease the bin width. If sampling is performed at f$_s$=1 Msps (current digitizers work in binary numbers to facilitate frequency domain processing, i.e., 1 Msps is 1,048,576 samples per second ($2^{20}$)), the DFT resolution (bin width) is 16 Hz. (1,048,576/65536).

The weighted samples within the filter window 66 correspond to a selectable frequency sub-band within the 1 GHz analog input signal bandwidth in order to produce a correlated digital sequence 67, which comprises a filtered subset of the frequencies of the input signal.

The signal processor 60 further includes a bank of filters 68 for performing an inverse discrete Fourier transform (IDFT) for transforming the window-filtered frequency domain signal back into the time domain. The real and imaginary components of the transformed time domain signal are then combined by a combining circuit 70 into a single signal phasor s'(t). Time domain signal s'(t) essentially represents the portion of the originally received analog input signal s(t) within the frequency sub-band selected by the frequency window filter. A measurement circuit 72 determines the peak voltage associated with signal phasor s'(t) and compares the measured peak voltage with a desired threshold voltage V$_t$ stored in a memory unit 90 and the difference is recorded in memory unit 90. Memory unit 90 can be, for example, a magnetic, optical or other conventional data recording media, such as a read-writable CD ROM for storing and retrieving raw and processed signal data, and is preferably non-volatile (data is not lost upon removal of power).

In digital communications, one of the key figures of merit is the Bit Error Rate (BER) related to give Signal to Noise Ratio (SNR) and to given Energy per Bit to Noise Density Ratio (E$_b$/N$_o$). In the automated EMI signal processing system according to the present invention, one is analyzing the accuracy of a given estimator attempting to estimate phase, frequency (time derivative of the frequency, or rate of change of the phase) and/or amplitude. The key figure of establishing merit is the Cramer-Rao (CR) bound, which gives a lower bound on the estimator variance. The CR bound is simply given by:

$$\sigma_{est}^2(\gamma) = \frac{\sigma_n^2}{2B \int_0^T \left[\frac{\delta \ln[s(t, \gamma)]}{\delta \gamma}\right]^2 p(t|\lambda) dt}$$

where $s(t,\gamma)$ is the pre-detected signal
 $\gamma$ is the parameter to be estimated
 $\sigma_n$ is the Noise Power at the Bandpass Filter output
 B is the filter bandwidth
 $P(t|\gamma)$ is the probability density function the signal conditioned on the parameter to be estimated In the system of the present invention, detecting the presence of energy, i.e., the interferer, within specified frequency bands is of interest. The detection can be performed in the frequency domain or in the time domain (they are essentially equivalent). However, typical EMI measurement standards state requirements in terms of peak and rms voltage, which are more straightforward to compute in the time domain. The accuracy of the peak voltage measurement directly depends on the accuracy with which a frequency bandwidth was estimated. To this extent, the CR Bounds are applied to both frequency and amplitude in the system of the present invention.

Obtaining the signal spectrum, through a frequency domain transform like the DFT, provides the information to identify not only peak values but also spectral shape in a given bandwidth. The conventional EMI tests require that peak voltages be identified; however, the peak power (equivalent to voltage if the impedance is known) can be identified as well as the distribution of the power (Power Spectral Density). The latter can be used to check for compliance with spectral "masks."

Preferably, the sampled digital signal supplied to digital signal processor 60 and the window filter data used to filter the frequency domain signal are also recorded along with any other data necessary to fully reproduce the signal processing. For example, the outputs at each of the stages in signal processing, including the FFT filtered signal, the IFFT time-domain signal, and the detected peak amplitude signal (detected output) and the detection threshold level may be stored in a storage device or non-volatile memory 90. Storage device 90 collects the raw digitized signal for permanent storage to get the samples stored in non-volatile memory as well as in Random Access Memory (RAM) which is volatile with respect to power turned off or power failure.

Storage of this information allows for complete and absolute reproducibility of the EMI test and permits using different window filters on the recorded digital signal to refine EMI analysis, such as enhanced spectral analysis. Storage of the signal being tested and the signal processing parameters is particularly advantageous in the event changes are made in the system. For example, if after a given RF input signal 5 is applied and the output is analyzed and stored in memory 90, changes are made to the functionality of the signal processing, the same input signal can be re-introduced into the system to determine the effects of the changes in the signal processing on the detected output peak signals.

A controller 74 responsive to measurement circuit 72 controls the frequency window filter 66 to select the particular one of the frequency sub-bands in which to perform the multiplication of the I and Q frequency domain signals with the weighted sample points within the frequency domain. The controller operates to iteratively select each of the sub-bands in order to perform the signal analysis and determination of the peak voltages with respect to threshold voltages over the entire 1 GHz bandwidth. In the exemplary embodiment, controller 74 may be a conventional micro controller or other type of controller for controlling the filter and sample weight selection.

In the case where only a sub-band segment of the bandwidth of interest is digitized at once, controller 74 controls the front end down-converter and tuning circuit 30 and band-pass filter 40 in order to dictate which 10 MHz segment is being digitized and processed (first sub-band tuning) and also controls the DSP sub-band scanning within a particular 10 MHz segment (second sub-band tuning).

The technique of the present invention advantageously permits scanning to be performed in a relatively large bandwidth, and the analysis can be selectively performed on different sub-bands. This is accomplished by performing sub-band selection comprising filtering in the frequency domain.

Figure 4:
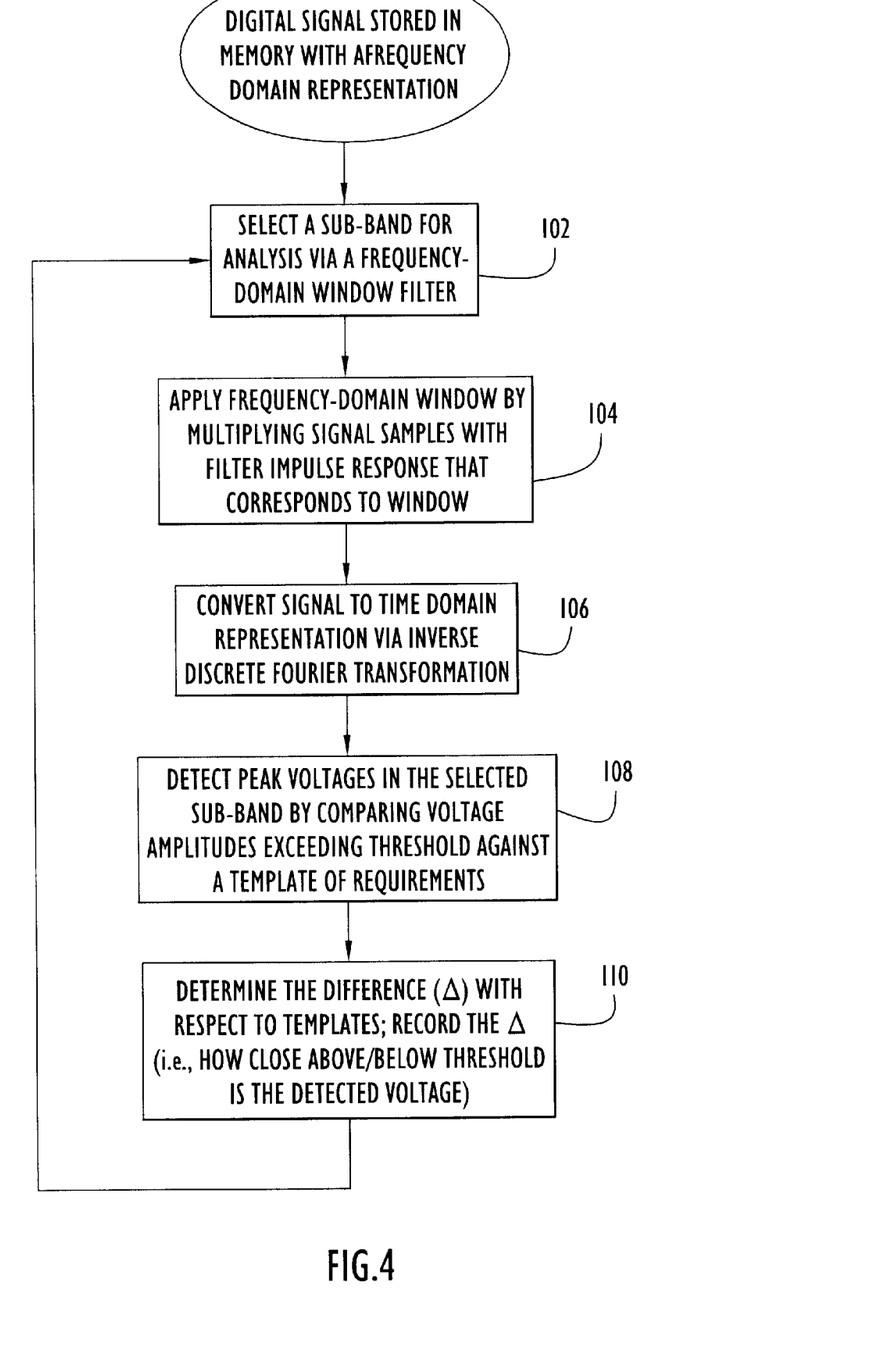
FIG. 4 is a functional flow diagram illustrating the processing steps for scanning sub-bands of the frequency band under test in accordance with the exemplary embodiment of the present invention.

FIG. 4 is a functional flow diagram illustrating the processing steps for scanning sub-bands of the frequency band under test. Once analog-to-digital converter 50 has digitized the input signal and the signal has been processed by DFT filters 64 to produce a frequency domain representation of the input signal, controller 74 selects a sub-band for analysis by applying a frequency-domain window filter (operation 102). The frequency-domain window filter is then applied to the frequency-domain signal by multiplying the FFT signal points by a weighted set of sample points representing the filter impulse response that corresponds to the selected frequency-domain window (operation 104), thereby producing a series of bins of a predefined frequency range. In operation 106, the signal is converted a time domain representation via an inverse discrete Fourier transformation (e.g., a series of IFFT filters are applied to the frequency bins in order to reconvert the signal back into the time-domain).

Peak voltages are detected in the selected sub-band by comparing voltage amplitudes of the time domain signal to a detection threshold (operation 108). The detection threshold is established based on a template of detection requirements, as described above. The measured peak voltage is indicative of the EMI emitted from the electronic device under test in a particular sub-band. The differences between the peak voltages and the detection threshold is determined (i.e., how much above or below the threshold the detected peak voltage lies) and recorded (operation 110). Controller 74 then operates to iteratively select a next one of the N pre-stored sample windows which correspond to a particular sub-band to obtain a next bandwidth subset in which to perform frequency-domain windowing, IDFT processing, signal combining and peak voltage measurement and recording.

One of the key advantages of the digital approach of the present invention is that the processing loop shown in FIG. 4 can be performed with data collected and already stored in the computer memory. Applying the described filtering technique, any bandwidth can be selected any number of times. The analysis of different bandwidths is performed on the exact same data which is collected once. With an analog device, the data must be collected for each bandwidth selection. This approach could leave out EMI pulses in different bands which appeared once and do not repeat when the next N bands are selected (transient interference). For example, in a conventional scan, say from 1 KHz to 100 KHz, each sample requires receiving a new section of the signal. This means that transients present at a given instant of time may not be present when the scan is done in the 30 KHz bandwidth (going from 1 to 100 KHz). Another advantage of the automated digital approach is the number of simulations that can be performed to determine the effectiveness of different algorithms. The filters can be prestored; however, there are situations where it may be desirable to try different filtering approaches, based on the observed data.

Moreover, the same data can be processed to carry out broad and narrow band scans of any desired bandwidth, simply by selecting the appropriate frequency domain filters. Thus, for example, any number of scans, from a very narrow band scan (e.g., analyzing sub-bands on the order of a fraction of a kilohertz) to broad band scans (on the order of megahertz) can be performed on the same stored digital signal.

The techniques of the present invention described herein will detect and measure interference levels whether they are continuous wave or impulsive in nature. The detection of impulsive noise is limited by the system bandwidth (BW):

$BW=1/\tau$ where t is the impulse duration.

For $\tau=1$ nsec the required system BW is 1 GHz. However, the system described here can still detect the pulse, since through the process of digital sampling the pulse will appear aliased in the analysis bandwidth.

The automated digital signal processing approach according to the present invention offers several advantages over conventional analog processing. Recordation of digitally sampled signals and processing parameters permits precise repeatability of EMI tests and allows for extensive off-line analysis. For development and/or testing purposes, one can store digitally sampled signals in a recording media which will provide exactly the same results when processed using the same algorithm. This capability aids in test and development of new algorithms and techniques.

A major improvement of the present invention over the prior art EMI testing is in improving the speed of testing by a significant factor. By automating certain test functions which have been performed manually by an experienced or certified operator or EMI technician with an integrated digital signal processing system, improvements of orders of magnitude are possible. The conventional approach of visually or aurally detecting the presence of a signal is highly dependent on the skill of the operator and the signal characteristics of a particular test. In accordance with the present invention, digital signal processing techniques are used to recognize a particular signal or its given variations so that the number of bandwidths that can be scanned per second is limited only by the data collection rate and algorithm processing speed. Given current analog-to-digital converter and DSP technology, hundreds or even thousands of bandwidths can be processed every second.

Another benefit of this type of processing is the elimination/reduction of human error. Given the tedium of EMI testing, it is quite conceivable that some weaker signals are passed over during a test. Computer software algorithms operate to mitigate this problem.

While the present invention has been described in the context of a particular EMI testing scheme for illustrative purposes, it will be understood that the invention is not limited to not limited to any particular test scheme, scanning sequence or frequency bands or sub-bands.

Having described preferred embodiments of new and improved methods and apparatus for detecting electromagnetic interference, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of detecting electromagnetic emissions from a device under test, comprising:
   (a) receiving an electromagnetic signal in a frequency band;
   (b) digitally sampling the electromagnetic signal to generate a digital signal that is in the time domain;
   (c) converting the digital signal to a frequency-domain signal;
   (d) selecting a frequency sub-band within the frequency band by filtering the frequency-domain signal;
   (e) converting the filtered frequency-domain signal to a time-domain signal; and
   (f) measuring the time-domain signal to determine a level of electromagnetic emissions from the device in the frequency sub-band.

2. The method of claim 1, wherein (d) includes applying a frequency window filter to the frequency-domain signal to select the frequency sub-band.

3. The method of claim 1, further comprising scanning the frequency band by repeating (d), (e) and (f) with frequency window filters corresponding to different frequency sub-bands.

4. The method of claim 1, wherein (f) includes comparing an amplitude of the time-domain signal to a threshold to determine whether electromagnetic emissions in the sub-band exceed a certain level.

5. The method of claim 1, wherein (a) includes:
   (a1) down-converting the received signal to a baseband signal; and
   (a2) band-pass filtering the baseband signal to perform analog anti-aliasing.

6. The method of claim 1, wherein (a) includes:
   (a1) down-converting the received signal to a baseband signal; and
   (a2) selecting a frequency sub-band segment of the frequency band of the baseband signal;
      wherein (b) includes digitally sampling the frequency sub-band segment of the electromagnetic signal to generate the digital signal.

7. The method of claim 6, wherein (a2) includes band-pass filtering the frequency sub-band segment of the electromagnetic signal via an anti-aliasing filter.

8. The method of claim 1, wherein (c) includes performing a discrete Fourier transform on the digital signal to form the frequency-domain signal.

9. The method of claim 1, wherein (c) includes:
   (c1) performing a Hilbert transform on the digital signal to form a complex analytic signal; and
   (c2) performing a discrete Fourier transform on the complex analytic signal to form the frequency-domain signal as a complex frequency-domain signal.

10. The method of claim 9, wherein (d) includes applying a frequency window filter to the complex frequency-domain signal by multiplying the complex frequency-domain signal with a set of weighted samples corresponding to the frequency sub-band to form a filtered complex frequency-domain signal.

11. The method of claim 1, wherein (e) includes (e1) applying an inverse discrete Fourier transform to the filtered frequency-domain signal to form the time-domain signal.

12. The method of claim 11, wherein the time-domain signal includes in-phase and quadrature components, and wherein (e) further includes:
  (e2) combining the in-phase and quadrature components of the time-domain signal to form a signal phasor.

13. The method of claim 12, wherein (f) includes:
  (f1) measuring an amplitude of the signal phasor; and
  (f2) comparing the amplitude to a threshold value to produce an output signal indicative of a level of electromagnetic interference.

14. The method of claim 1, further comprising:
  (g) storing the digital signal; and
  (h) repeating (c), (d), (e) and (f) on the stored digital signal.

15. The method of claim 14, wherein (h) is performed using different processing parameters to refine analysis of the digital signal.

16. The method of claim 14, wherein (h) is performed using identical processing parameters to reproduce analysis of the digital signal.

17. The method of claim 14, further comprising:
  (i) storing signal processing parameters used to select the frequency sub-band.

18. The method of claim 1, wherein the electromagnetic emissions are radiated.

19. The method of claim 1, wherein the electromagnetic emissions are received via a conductor.

20. An apparatus for detecting electromagnetic emissions from a device under test, comprising:
  a receiver configured to receive an electromagnetic signal in a frequency band;
  an analog-to-digital converter responsive to the electromagnetic signal for generating a digital signal that is in the time domain;
  a time-domain signal transformer configured to transform the digital signal to a frequency-domain signal;
  a sub-band selector configured to select a frequency sub-band within the frequency band by filtering the frequency-domain signal;
  a frequency-domain signal transformer configured to transform the filtered frequency-domain signal to a time-domain signal; and
  a measurement circuit configured to measure the time-domain signal to determine a level of electromagnetic emissions from the device in the frequency sub-band.

21. The apparatus of claim 20, wherein said sub-band selector applies a frequency window filter to the frequency-domain signal to select the frequency sub-band.

22. The apparatus of claim 20, further comprising a controller coupled to at least said sub-band selector, said controller effecting a scan of the frequency band by commanding said sub-band selector to successively apply to the frequency-domain signal, frequency window filters corresponding to different frequency sub-bands.

23. The apparatus of claim 20, wherein said measurement circuit compares an amplitude of the time-domain signal to a threshold to determine whether electromagnetic emissions in the sub-band exceed a certain level.

24. The apparatus of claim 20, wherein said receiver includes:
  a sub-band tuner and down converter configured to down-convert the received signal to a baseband signal; and
  a band-pass anti-aliasing filter configured to band-pass the baseband signal to perform analog anti-aliasing.

25. The apparatus of claim 20, wherein said receiver includes:
  a sub-band tuner and down converter configured to down-convert the received signal to a baseband signal and select a frequency sub-band segment of the frequency band of the baseband signal; and
  a band-pass anti-aliasing filter configured to band-pass the frequency sub-band segment to perform analog anti-aliasing, wherein said analog-to-digital converter digitally samples the frequency sub-band segment of the electromagnetic signal to generate the digital signal.

26. The apparatus of claim 20, wherein said time-domain signal transformer comprises discrete Fourier transform filters for converting the digital signal to the frequency-domain signal.

27. The apparatus of claim 26, wherein said time-domain signal transformer further includes Hilbert transform filters for performing a Hilbert transform on the digital signal to form a complex analytic signal, wherein said discrete Fourier transform filters perform a discrete Fourier transform on the complex analytic signal to form the frequency-domain signal as a complex frequency-domain signal.

28. The apparatus of claim 27, wherein said sub-band selector applies a frequency window filter to the complex frequency-domain signal by multiplying the complex frequency-domain signal with a set of weighted samples corresponding to the frequency sub-band to form a filtered complex frequency-domain signal.

29. The apparatus of claim 20, wherein said frequency-domain signal transformer comprises an inverse discrete Fourier transform filter for applying an inverse discrete Fourier transform to the filtered frequency-domain signal to form the time-domain signal.

30. The apparatus of claim 29, wherein the time-domain signal includes in-phase and quadrature components, and wherein said apparatus further comprises a combining circuit configured to combine the in-phase and quadrature components of the time-domain signal to form a signal phasor.

31. The apparatus of claim 30, wherein said measurement circuit measures an amplitude of the signal phasor and compares the amplitude to a threshold value to produce an output signal indicative of a level of electromagnetic interference.

32. The apparatus of claim 20, further comprising a non-volatile storage device configured to store the digital signal.

33. The apparatus of claim 32, wherein said non-volatile memory stores signal processing parameters used to select the frequency sub-band.

34. The apparatus of claim 20, further comprising an antenna configured to receive radiated electromagnetic emissions.

35. The apparatus of claim 20, wherein the electromagnetic emissions are received via a conductor.

36. An apparatus for detecting electromagnetic emissions from a device under test, comprising:
  means for receiving an electromagnetic signal in a frequency band;
  means for converting the electromagnetic signal to a digital signal that is in the time domain;
  means for transforming the digital signal to a frequency-domain signal;
  means for selecting a frequency sub-band within the frequency band by filtering the frequency-domain signal;

means for transforming the filtered frequency-domain signal to a time-domain signal; and means for measuring the time-domain signal to determine a level of electromagnetic emissions from the device in the frequency sub-band.

37. The apparatus of claim 36, wherein said means for selecting selects the frequency sub-band by applying a frequency window filter to the frequency-domain signal.

38. The apparatus of claim 36, further comprising:

means for controlling a scan of the frequency band by controlling said means for selecting to successively applying to the frequency-domain signal frequency window filters corresponding to different frequency sub-bands.

39. The apparatus of claim 36, wherein said means for measuring compares an amplitude of the time-domain signal to a threshold to determine whether electromagnetic emissions in the sub-band exceed a certain level.

40. The apparatus of claim 36, wherein said means for receiving includes:

means for down-converting the received signal to a baseband signal; and means for band-pass filtering the baseband signal to perform analog anti-aliasing.

41. The apparatus of claim 40, wherein said means for receiving includes:

means for selecting a frequency sub-band segment of the frequency band of the baseband signal, wherein said means for band-pass filtering filters the frequency sub-band segment and said means for converting digitally samples the frequency sub-band segment of the electromagnetic signal to generate the digital signal.

42. The apparatus of claim 36, wherein said means for transforming the digital signal comprises Hilbert transform filters for performing a Hilbert transform on the digital signal to form a complex analytic signal, and discrete Fourier transform filters for performing a discrete Fourier transform on the complex analytic signal to form the frequency-domain signal as a complex frequency-domain signal.

43. The apparatus of claim 42, wherein said means for selecting applies a frequency window filter to the complex frequency-domain signal by multiplying the complex frequency-domain signal with a set of weighted samples corresponding to the frequency sub-band to form a filtered complex frequency-domain signal.

44. The apparatus of claim 36, wherein said means for transforming the filtered frequency-domain signal comprises an inverse discrete Fourier transform filter for applying an inverse discrete Fourier transform to the filtered frequency-domain signal to form the time-domain signal.

45. The apparatus of claim 36, wherein the time-domain signal includes in-phase and quadrature components, and wherein said apparatus further comprises means for combining the in-phase and quadrature components of the time-domain signal to form a signal phasor.

46. The apparatus of claim 45, wherein said means for measuring measures an amplitude of the signal phasor and compares the amplitude to a threshold value to produce an output signal indicative of a level of electromagnetic interference.

47. The apparatus of claim 36, further comprising means for storing the digital signal and signal processing parameters used to select the frequency sub-band in a non-volatile manner.

48. The apparatus of claim 36, further comprising means for receiving radiated electromagnetic emissions.

49. The apparatus of claim 36, wherein the electromagnetic emissions are received via a conductor.

* * * * *